United States Patent
Sukata

(10) Patent No.: US 12,297,377 B2
(45) Date of Patent: May 13, 2025

(54) CONDUCTIVE ADHESIVE COMPOSITION, AND METHOD FOR PRODUCING CONNECTION STRUCTURE

(71) Applicant: Resonac Corporation, Tokyo (JP)

(72) Inventor: Shinichirou Sukata, Tokyo (JP)

( * ) Notice: Subject to any disclaimer, the term of this patent is extended or adjusted under 35 U.S.C. 154(b) by 212 days.

(21) Appl. No.: 17/760,303

(22) PCT Filed: Feb. 8, 2021

(86) PCT No.: PCT/JP2021/004607
§ 371 (c)(1),
(2) Date: Nov. 1, 2022

(87) PCT Pub. No.: WO2021/161963
PCT Pub. Date: Aug. 19, 2021

(65) Prior Publication Data
US 2023/0087229 A1    Mar. 23, 2023

(30) Foreign Application Priority Data

Feb. 12, 2020    (JP) .................................. 2020-021335

(51) Int. Cl.
*C09J 11/04*    (2006.01)
*C09J 11/06*    (2006.01)
(Continued)

(52) U.S. Cl.
CPC ................ *C09J 11/04* (2013.01); *C09J 11/06* (2013.01); *C09J 163/00* (2013.01); *H01B 1/22* (2013.01);
(Continued)

(58) Field of Classification Search
CPC ...... C08K 2003/0837; C08K 2001/001; C08K 2001/005; C08K 3/08; C08K 5/09;
(Continued)

(56) References Cited

U.S. PATENT DOCUMENTS

| | | | |
|---|---|---|---|
| 2009/0269598 A1* | 10/2009 | Ohashi | H01B 1/22 428/458 |
| 2012/0228560 A1* | 9/2012 | Jang | C09J 9/02 977/773 |

(Continued)

FOREIGN PATENT DOCUMENTS

| | | |
|---|---|---|
| JP | 2006-199937 | 8/2006 |
| JP | 2015-026519 | 2/2015 |

(Continued)

OTHER PUBLICATIONS

International Search Report dated Apr. 6, 2021 for PCT/JP2021/004607.

(Continued)

*Primary Examiner* — Philip C Tucker
*Assistant Examiner* — Brian R Slawski
(74) *Attorney, Agent, or Firm* — SOEI PATENT & LAW FIRM

(57) ABSTRACT

A conductive adhesive composition, the composition containing: (A) conductive particles; (B) a thermosetting resin; and (C) a flux activator. The conductive particles contain a metal having a melting point of 200° C. or lower. In a volume-based cumulative particle size distribution of the conductive particles, a cumulative 50% particle diameter D50 is 3 to 10 µm, and a cumulative 10% particle diameter D10 is 2.4 µm or more. The flux activator contains a compound having a hydroxyl group and a carboxyl group.

10 Claims, 2 Drawing Sheets

(51) Int. Cl.
*C09J 163/00* (2006.01)
*H01B 1/22* (2006.01)
*H01L 21/50* (2006.01)

(52) U.S. Cl.
CPC .... *H01L 21/50* (2013.01); *H01L 2224/16225* (2013.01); *H01L 2224/32225* (2013.01); *H01L 2224/73204* (2013.01); *H01L 2224/81193* (2013.01)

(58) Field of Classification Search
CPC . C09J 11/04; C09J 11/06; C09J 163/00; C09J 201/00; H01B 1/22; H01L 21/50; H01L 2224/16225; H01L 2224/32225; H01L 2224/73204; H01L 2224/81993; H01L 24/26
USPC .......... 252/512, 519.3, 519.33; 174/257, 259
See application file for complete search history.

(56) References Cited

U.S. PATENT DOCUMENTS

2015/0357497 A1* 12/2015 Mu ................. C09D 123/0869
 136/256
2017/0321000 A1* 11/2017 Maruko ................. C08G 59/42

FOREIGN PATENT DOCUMENTS

| JP | 2016-026519 | 2/2016 | |
| JP | 2017-112312 | 6/2017 | |
| JP | 2018-168336 | 11/2018 | |
| JP | 2018168336 A * | 11/2018 | ............. C09J 11/04 |
| TW | 202006750 | 2/2020 | |
| WO | 2019/013336 | 1/2019 | |

OTHER PUBLICATIONS

International Preliminary Report on Patentability with Written Opinion dated Aug. 25, 2022 for PCT/JP2021/004607.

* cited by examiner

CONDUCTIVE ADHESIVE COMPOSITION, AND METHOD FOR PRODUCING CONNECTION STRUCTURE

CROSS-REFERENCE TO RELATED APPLICATIONS

This application is a 35 U.S.C. § 371 national phase application of PCT/JP2021/004607, filed on Feb. 8, 2021, which claims priority to Japanese Patent Application No. 2020-021335, filed on Feb. 12, 2020.

TECHNICAL FIELD

The present disclosure relates to a conductive adhesive composition used for electrically connecting an electronic component and a circuit board, and a method for producing a connection structure using the conductive adhesive composition.

BACKGROUND ART

There is a case where a paste form conductive adhesive in which metal particles are dispersed in a thermosetting resin is used as a material for connecting an electronic component to a circuit board (for example, refer to Patent Literature 1).

When applying the conductive adhesive composition to connect a micro electrode pad or connection terminals arranged at a narrow pitch, in order to prevent a short circuit due to a bridge between electrodes and to attain sufficient conduction with a small coating amount, it is effective to some extent to apply a conductive adhesive containing conductive particles having a small particle diameter. However, in a case of the conductive particles having a small particle diameter such as an average particle diameter of 10 μm or less, since a specific surface area is large, there is a tendency that the amount of oxide film to be formed on the surface increases, thereby remarkably degrading melting properties and joinability. In a case where the melting properties and the joinability are degraded, the conductivity of the conductive adhesive is degraded. In addition, there is a possibility that unmelted conductive particles are drifted to a region outside the electrode pad, which causes a short circuit between the electrodes.

Accordingly, a conductive adhesive composition is proposed in which connection properties are improved and resistance to a temperature cycling test is improved by increasing the amount of flux activator to some extent (refer to Patent Literature 2).

CITATION LIST

Patent Literature

Patent Literature 1: Japanese Unexamined Patent Publication No. 2006-199937
Patent Literature 2: International Publication WO 2019/013336

SUMMARY OF INVENTION

Technical Problem

However, in a case where the amount of flux activator is large, there is a tendency that curing properties of the conductive adhesive are degraded, and as a result, a decrease in adhesion strength after curing is manifested. In addition, in a connection structure in which the electronic component and the circuit board are connected, resistance to a reflow test at 260° C. is also required, but since physical properties of a resin portion containing the conductive adhesive are degraded by a large amount of flux activator, in a reflow resistance test at 260° C., the resin portion is destroyed by heat expansion of a metal portion, which may cause a conduction failure.

Therefore, one aspect of the present disclosure relates to a conductive adhesive composition containing conductive particles having a comparatively small particle diameter, and an object thereof is to improve resistance to a temperature cycling test and resistance to a reflow resistance test at 260° C. while mounting an electronic component on a circuit board with sufficient adhesion strength and excellent conductivity when using the conductive adhesive composition to electrically connect the circuit board and the electronic component mounted on the circuit board.

Solution to Problem

An aspect of the present disclosure provides a conductive adhesive composition that is used for electrically connecting a circuit board and an electronic component mounted on the circuit board. In other words, an aspect of the present disclosure provides an application of a conductive adhesive composition for electrically connecting a circuit board and an electronic component mounted on the circuit board. The conductive adhesive composition comprises: (A) conductive particles; (B) a thermosetting resin; and (C) a flux activator. The conductive particles comprise a metal having a melting point of 200° C. or lower. In a volume-based cumulative particle size distribution of the conductive particles, D50 is 3 to 10 μm, and D10 is 2.4 μm or more. The flux activator comprises a compound having a hydroxyl group and a carboxyl group.

In the conductive adhesive composition according to the present invention described above, since the conductive particles have D10 of 2.4 μm or more while having a comparatively small particle diameter such as D50 of 3 to 30 μm, a ratio of fine particles having a particle diameter of 2.4 μm or less with a large specific surface area is small. Accordingly, conductivity is less likely to be degraded by the influence of an oxide film on the surface of the conductive particles, thereby ensuring excellent conductivity while maintaining sufficient adhesion strength. In addition, in a temperature cycling test and a reflow test at 260° C., initial low connection resistance is maintained.

Another aspect of the present invention provides a method for producing a connection structure. The method according to an aspect of the present invention comprises: a step of preparing a circuit board comprising two or more connection terminals and an electronic component comprising two or more connection terminals, and placing the conductive adhesive composition described above on the connection terminal of the circuit board or on the connection terminal of the electronic component; a step of arranging the electronic component on the circuit board such that the connection terminal of the circuit board faces the connection terminal of the electronic component via the conductive adhesive composition, to obtain a temporary connection body comprising the circuit board, the conductive adhesive composition, and the electronic component; and a step of heating the temporary connection body and thereby forming a connection part comprising a conductive portion and a resin portion, the conductive portion comprising conductive particles in the conductive adhesive composition and electrically connecting the connection terminal of the circuit board and the connection terminal of the electronic component and said resin portion being formed around said conductive portion, to obtain a connection structure in which the circuit board and the electronic component are joined by the connection part.

Advantageous Effects of Invention

According to an aspect of the present disclosure, a conductive adhesive composition containing conductive particles having a comparatively small particle diameter is provided in which resistance to a temperature cycling test and resistance to a reflow resistance test at 260° C. can be improved while mounting an electronic component on a circuit board with sufficient adhesion strength and excellent conductivity when using the conductive adhesive composition to electrically connect the circuit board and the electronic component mounted on the circuit board. In the conductive adhesive composition according to an aspect of the present disclosure, adhesion strength and conductivity can be improved to a level where demand properties relevant to a reflow test at 260° C. can be cleared, while suppressing a short circuit due to a bridge between connection terminals arranged at a narrow pitch. The conductive adhesive composition according to an aspect of the present disclosure is also advantageous in that a decrease in a connection temperature and the warpage of a small and thin device in a step of mounting the electronic component on the circuit board are suppressed. The conductive adhesive composition according to the present disclosure is capable of reducing a flux content that causes voids in a connection part, thereby being also suitable for connecting fine connection terminals.

DESCRIPTION OF EMBODIMENTS

Figure 1:
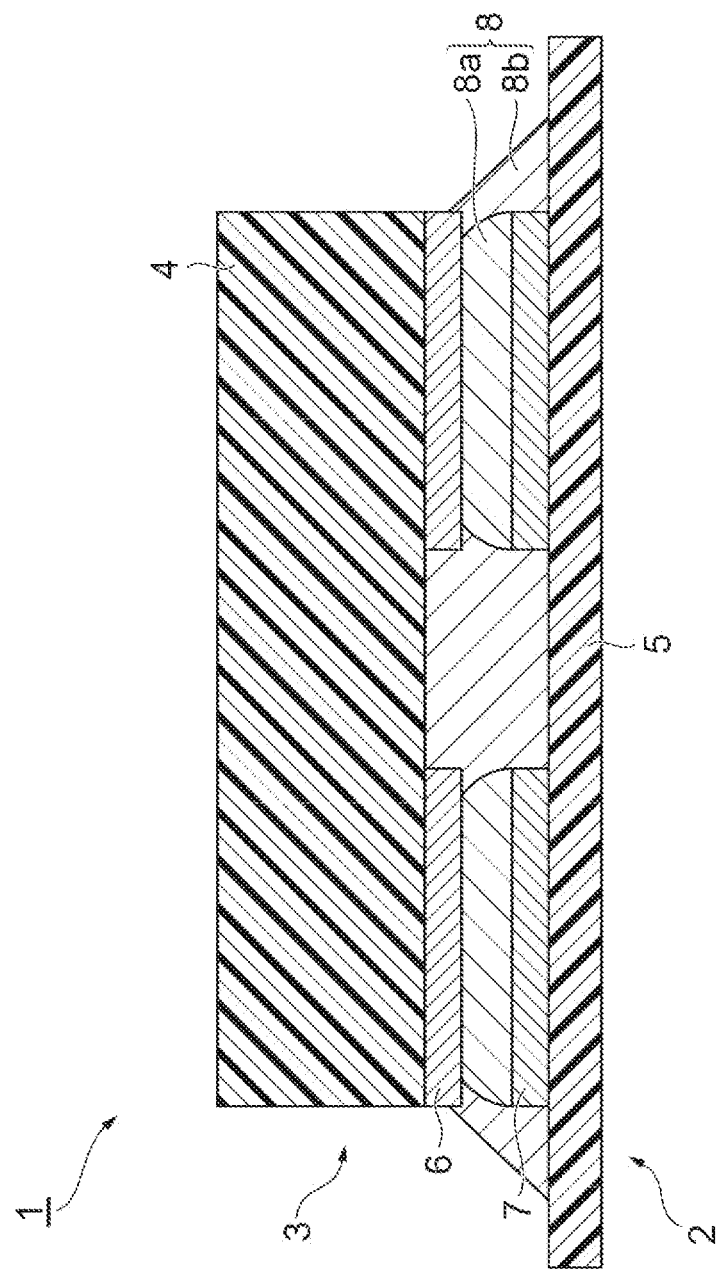
FIG. 1 is a schematic sectional view illustrating an embodiment of a connection structure.

Hereinafter, some embodiments of the present invention will be described in detail. Here, the present invention is not limited to the following embodiments.

A conductive adhesive composition according to an embodiment, contains: (A) conductive particles; (B) a thermosetting resin; and (C) a flux activator.

(A) The conductive particles contain a metal having a melting point of 200° C. or lower. The melting point of the metal contained in the conductive particles may be 180° C. or lower, or 150° C. or lower. A lower limit of the melting point of the metal in the conductive particles is not particularly limited, and is approximately 100° C. In a case where such conductive particles are used in the conductive adhesive composition, it is considered that the conductive particles are melted and aggregated at a comparatively low temperature, and the aggregate contributes to electrical connection of connection terminals. In a case where the metal contained in the conductive particles is an alloy containing two or more types of metals, a melting point of the alloy may be 200° C. or lower.

The metal in the conductive particles may contain metals other than lead, from the viewpoint of reducing an environmental load. Examples of the metal contained in the conductive particles include one type of elemental metal selected from tin (Sn), bismuth (Bi), indium (In), and zinc (Zn), or an alloy containing two or more types of metals. The alloy may further contain a component having a high melting point that is selected from platinum (Pt), gold (Au), silver (Ag), copper (Cu), nickel (Ni), palladium (Pd), aluminum (Al), and the like, in a range where the melting point of the entire metal in the conductive particles is 200° C. or lower, from the viewpoint that more excellent connection reliability can be obtained.

Specific examples of the metal configuring the conductive particles include Sn42-Bi58 solder (a melting point of 138° C.), Sn48-In52 solder (a melting point of 117° C.), Sn42-Bi57-Ag1 solder (a melting point of 139° C.), Sn90-Ag2-Cu0.5-Bi7.5 solder (a melting point of 189° C.), Sn96-Zn8-Bi3 solder (a melting point of 190° C.), and Sn91-Zn9 solder (a melting point of 197° C.). Such metals exhibit a clear solidification behavior after melting. The solidification behavior indicates that the metal is cooled and solidified after being melted. The conductive particles may contain Sn42-Bi58 solder, from the viewpoint of obtainability and effects. Such metals can be used singularly, or two or more types thereof can be used in combination.

In a volume-based cumulative particle size distribution of the conductive particles, a cumulative 50% particle diameter D50 may be 3 to 10 μm. Here, the cumulative particle size distribution is measured by a laser diffraction/scattering method. In a case where D50 is 3 μm or more, the conductive adhesive composition is likely to have a suitably low viscosity, and excellent workability can be ensured. In addition, there is a tendency that the amount of flux activator that is required to obtain sufficient melting properties of the conductive particles decreases. In a case where the amount of flux activator is small, a resin cured product containing the conductive adhesive composition is likely to maintain excellent physical properties (adhesiveness at a high temperature, or the like). Further, in a reflow test at 260° C., a resin portion is less likely to be destroyed by the expansion of a conductive portion containing the metal. In a case where D50 of the conductive particles is 10 μm or less, a short circuit between the connection terminals due to a bridge between the adjacent connection terminals is less likely to occur when connecting the connection terminals and electronic components arranged at a narrow pitch. In addition, the conductive adhesive composition can be easily applied to the connection terminal having a small area by any method of a printing method, a transferring method, and a dispensing method. D50 of the conductive particles may be 4 to 9 μm, from the viewpoint of making coating properties and the workability of the conductive adhesive composition more excellent. D50 of the conductive particles may be 5 to 8 μm, from the viewpoint of improving preservation stability of the conductive adhesive composition and mounting reliability of the cured product.

In the volume-based cumulative particle size distribution of the conductive particles, a cumulative 10% particle diameter D10 may be 2.4 μm or more. In a case where D10 is 2.4 μm or more, since there is a tendency that the amount of flux activator that is required decreases for the same reason as described above, for example, reflow resistance at 260° C. is easily maintained at a high level. From the same viewpoint, a minimum particle diameter Dmin in the cumulative particle size distribution may be 1.0 μm or more. D10 may be 2.9 μm or less, and Dmin may be 2.5 μm or less.

In the volume-based cumulative particle size distribution of the conductive particles, a cumulative 90% particle diameter D90 may be 12 μm or less. In a case where D90 is 12 μm or less, there is a tendency that the occurrence of a short circuit due to the bridge between the connection terminals is suppressed. From the same viewpoint, a maximum particle diameter Dmax may be 20 μm or less. D90 may be 10 μm or more, and Dmax may be 13 μm or more.

A specific surface area of the conductive particles may be $1.45 \times 10^{-4}$ to $8.45 \times 10^{-4}$ cm$^2$/g.

The conductive particles may be metal particles containing only a metal, may be composite particles containing nuclear particles that contain a solid material other than a metal, such as ceramic, silica, and a resin material, and a metal film that covers the surface of the nuclear particles and contains a metal having a melting point of 200° C. or lower, or may be a combination thereof.

The content of the conductive particles may be 5 to 95% by mass, with respect to the total mass of the conductive adhesive composition. In a case where the content of the conductive particles is less than 5% by mass, there is a tendency that the conductivity of the cured product of the conductive adhesive composition is degraded. In a case where the content of the conductive particles is greater than 95% by mass, since the viscosity of the conductive adhesive composition increases, there is a tendency that the workability is degraded. In addition, since a ratio of a thermosetting adhesive component in the conductive adhesive composition relatively decreases, there is also a tendency that the mounting reliability is degraded. The content of the conductive particles may be 30 to 90% by mass, from the viewpoint of improving the workability or the conductivity, and may be 40 to 85% by mass, from the viewpoint of improving the mounting reliability of the conductive adhesive composition.

In addition to the conductive particles containing the metal having a melting point of 200° C. or lower, (a1) high-melting-point conductive particles that contain a metal having a melting point of higher than 200° C. may be contained in the conductive adhesive composition. Examples of the metal having a melting point of higher than 200° C. include one type of elemental metal selected from Pt, Au, Ag, Cu, Ni, Pd, Al, and Sn, or an alloy containing two or more types of metals. Specific examples of the high-melting-point conductive particles include an Au powder, an Ag powder, a Cu powder, an Ag-plated Cu powder, an Sn powder, and an Sn—Ag—Cu powder. As a commercial product of the high-melting-point conductive particles, "MA05K" (Product Name, manufactured by Hitachi Chemical Company, Ltd.) which is a silver-plated copper powder is available.

In a case of combining (A) the conductive particles containing the metal having a melting point of 200° C. or lower with (a1) the conductive particles containing the metal having a melting point of higher than 200° C., a mass ratio ((A):(a1)) of (A) the conductive particles containing the metal having a melting point of 200° C. or lower to (a1) the conductive particles containing the metal having a melting point of higher than 200° C. may be in a range of 99:1 to 50:50 or 99:1 to 60:40.

(B) The thermosetting resin has a function of adhering to an adherend, and functions as a binder component that binds the conductive particles in the conductive adhesive composition and a filler to be added as necessary to each other. Examples of the thermosetting resin include a thermosetting organic polymer compound such as an epoxy resin, a (meth)acrylic resin, a maleimide resin, a cyanate resin, and precursors thereof. The (meth)acrylic resin indicates a methacrylic resin and an acrylic resin. The thermosetting resin may be a compound having a polymerizable carbon-carbon double bond that is typified by a (meth)acrylic resin and a maleimide resin, or an epoxy resin. The thermosetting resin is excellent in heat resistance and the adhesiveness, and can also be handled in a liquid state insofar as the thermosetting resin is dissolved or dispersed in an organic solvent, as necessary, thereby being also excellent in the workability. The thermosetting resin may be an epoxy resin, from the viewpoint of the obtainability and the reliability. One type of such thermosetting resins can be used singularly, or two or more types thereof can be used in combination.

Here, the epoxy resin is a compound having two or more epoxy groups. Examples of the epoxy resin include a bisphenol A-type epoxy resin, a bisphenol F-type epoxy resin, a bisphenol AD-type epoxy resin, and an amine-type epoxy resin.

Specific examples of a commercially available epoxy resin include AER-X8501 (Product Name, manufactured by Asahi Kasei Corp.), R-301 (Product Name, manufactured by Mitsubishi Chemical Corporation), and YL-980 (Product Name, manufactured by Mitsubishi Chemical Corporation), which are a bisphenol A-type epoxy resin; YDF-170 (Product Name, manufactured by Tohto Kasei Co., Ltd.) and YL-983U (Product Name, manufactured by Mitsubishi Chemical Corporation), which are a bisphenol F-type epoxy resin; R-1710 (Product Name, manufactured by Mitsui Petroleum Chemical Industry Co., Ltd.) which is a bisphenol AD-type epoxy resin; N-730S (Product Name, manufactured by Dainippon Printing Ink Manufacturing Co., Ltd.) and Quatrex-2010 (Product Name, manufactured by The Dow Chemical Company), which are a phenol novolac-type epoxy resin; YDCN-702S (Product Name, manufactured by Tohto Kasei Co., Ltd.) and EOCN-100 (Product Name, manufactured by Nippon Kayaku Co., Ltd.), which are a cresol novolac-type epoxy resin; EPPN-501 (Product Name, manufactured by Nippon Kayaku Co., Ltd.), TACTIX-742 (Product Name, manufactured by The Dow Chemical Company), VG-3010 (Product Name, manufactured by Mitsui Petroleum Chemical Industry Co., Ltd.), and 10325 (Product Name, manufactured by Mitsubishi Chemical Corporation), which are a polyfunctional epoxy resin; HP-4032 (Product Name, manufactured by Dainippon Printing Ink Manufacturing Co., Ltd.) which is an epoxy resin having a naphthalene framework, EHPE-3150 and CEL-3000 (Product Name, both are manufactured by Daicel Chemical Industries, Ltd.), DME-100 (Product Name, manufactured by New Japan Chemical co., Ltd.), and EX-216L (Product Name, manufactured by Nagase Chemicals, Ltd.), which are an alicyclic epoxy resin; W-100 (Product Name, manufactured by New Japan Chemical co., Ltd.) which is an aliphatic epoxy resin; ELM-100 (Product Name, manufactured by Sumitomo Chemical Company, Limited), YH-434L (Product Name, manufactured by Tohto Kasei Co., Ltd.), TETRAD-X and TETRAD-C (Product Name, both are manufactured by MITSUBISHI GAS CHEMICAL COMPANY, INC.), and 630 and 630LSD (Product Name, both are manufactured by Mitsubishi Chemical Corporation), which are an amine-type epoxy resin; DENACOL EX-201 (Product Name, manufactured by Nagase Chemicals, Ltd.) which is a resorcine-type epoxy resin; DENACOL EX-211 (Product Name, manufactured by Nagase Chemicals, Ltd.) which is a neopentyl glycol-type epoxy resin; DENACOL EX-212 (Product Name, manufactured by Nagase Chemicals, Ltd.) which is 1,6-hexanediol diglycidyl ether; DENACOL EX series (EX-810, 811, 850, 851, 821, 830, 832, 841, and 861 (Product Name, all are manufactured by Nagase Chemicals, Ltd.)) which are an ethylenepropylene glycol-type epoxy resin; and E-XL-24 and E-XL-3L (Product Name, both are manufactured by Mitsui Chemicals, Inc.) which are an epoxy resin represented by General Formula (I) described below.

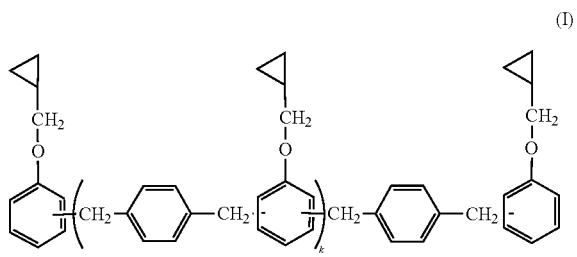

(I)

In Formula (I), k indicates an integer of 1 to 5.

In a case where the thermosetting resin contains the epoxy resin, the conductive adhesive composition may further contain an epoxy compound having one epoxy group as a reactive diluent. Specific examples of a commercially available product of the epoxy compound having one epoxy group include PGE (Product Name, manufactured by Nippon Kayaku Co., Ltd.), PP-101 (Product Name, manufactured by Tohto Kasei Co., Ltd.), ED-502, ED-509, and ED-509S (Product Name, manufactured by ADEKA CORPORATION), YED-122 (Product Name, manufactured by Yuka Shell Epoxy Co., Ltd.), KBM-403 (Product Name, manufactured by Shin-Etsu Chemical Co., Ltd.), and TSL-8350, TSL-8355, and TSL-9905 (Product Name, manufactured by Toshiba Silicone Co., Ltd.). One type of such epoxy compounds can be used singularly, or two or more types thereof can be used in combination.

In a case where the conductive adhesive composition contains the reactive diluent, the content of the reactive diluent may be in a range not remarkably impairing the effects of the present invention, and may be 0.1 to 30% by mass with respect to the total amount of the epoxy resin.

The thermosetting resin may contain a (meth)acrylic resin. The (meth)acrylic resin contains a compound having a polymerizable carbon-carbon double bond (an acryloyl group or a methacryloyl group). Examples of such a compound include a monoacrylate compound, a monomethacrylate compound, a diacrylate compound, and a dimethacrylate compound.

Examples of the monoacrylate compound include methyl acrylate, ethyl acrylate, propyl acrylate, isopropyl acrylate, n-butyl acrylate, isobutyl acrylate, t-butyl acrylate, amyl acrylate, isoamyl acrylate, hexyl acrylate, heptyl acrylate, octyl acrylate, 2-ethyl hexyl acrylate, nonyl acrylate, decyl acrylate, isodecyl acrylate, lauryl acrylate, tridecyl acrylate, hexadecyl acrylate, stearyl acrylate, isostearyl acrylate, cyclohexyl acrylate, isobornyl acrylate, diethylene glycol acrylate, polyethylene glycol acrylate, polypropylene glycol acrylate, 2-methoxyethyl acrylate, 2-ethoxyethyl acrylate, 2-butoxyethyl acrylate, methoxydiethylene glycol acrylate, methoxypolyethylene glycol acrylate, dicyclopentenyl oxyethyl acrylate, 2-phenoxyethyl acrylate, phenoxydiethylene glycol acrylate, phenoxypolyethylene glycol acrylate, 2-benzoyl oxyethyl acrylate, 2-hydroxy-3-phenoxypropyl acrylate, benzyl acrylate, 2-cyanoethyl acrylate, γ-acryloxyethyl trimethoxysilane, glycidyl acrylate, tetrahydrofurfuryl acrylate, dimethyl aminoethyl acrylate, diethyl aminoethyl acrylate, acryloxyethyl phosphate, and acryloxyethyl phenyl acid phosphate.

Examples of the monomethacrylate compound include methyl methacrylate, ethyl methacrylate, propyl methacrylate, isopropyl methacrylate, n-butyl methacrylate, isobutyl methacrylate, t-butyl methacrylate, amyl methacrylate, isoamyl methacrylate, hexyl methacrylate, heptyl methacrylate, octyl methacrylate, 2-ethyl hexyl methacrylate, nonyl methacrylate, decyl methacrylate, isodecyl methacrylate, lauryl methacrylate, tridecyl methacrylate, hexadecyl methacrylate, stearyl methacrylate, isostearyl methacrylate, cyclohexyl methacrylate, isobornyl methacrylate, diethylene glycol methacrylate, polyethylene glycol methacrylate, polypropylene glycol methacrylate, 2-methoxyethyl methacrylate, 2-ethoxyethyl methacrylate, 2-butoxyethyl methacrylate, methoxydiethylene glycol methacrylate, methoxypolyethylene glycol methacrylate, dicyclopentenyl oxyethyl methacrylate, 2-phenoxyethyl methacrylate, phenoxydiethylene glycol methacrylate, phenoxypolyethylene glycol methacrylate, 2-benzoyl oxyethyl methacrylate, 2-hydroxy-3-phenoxypropyl methacrylate, benzyl methacrylate, 2-cyanoethyl methacrylate, γ-methacryloxyethyl trimethoxysilane, glycidyl methacrylate, tetrahydrofurfuryl methacrylate, dimethyl aminoethyl methacrylate, diethyl aminoethyl methacrylate, methacryloxyethyl phosphate, and methacryloxyethyl phenyl acid phosphate.

Examples of the diacrylate compound include ethylene glycol diacrylate, 1,4-butanediol diacrylate, 1,6-hexanediol diacrylate, 1,9-nonanediol diacrylate, 1,3-butanediol diacrylate, neopentyl glycol diacrylate, diethylene glycol diacrylate, triethylene glycol diacrylate, tetraethylene glycol diacrylate, polyethylene glycol diacrylate, tripropylene glycol diacrylate, polypropylene glycol diacrylate, bisphenol A, a reactant of 1 mole of bisphenol F or bisphenol AD and 2 moles of glycidyl acrylate, diacrylate of a polyethylene oxide adduct of bisphenol A, bisphenol F, or bisphenol AD, diacrylate of a polypropylene oxide adduct of bisphenol A, bisphenol F, or bisphenol AD, bis(acryloxypropyl) polydimethyl siloxane, and a bis(acryloxypropyl) methyl siloxane-dimethyl siloxane copolymer.

Examples of the dimethacrylate compound include ethylene glycol dimethacrylate, 1,4-butanediol dimethacrylate, 1,6-hexanediol dimethacrylate, 1,9-nonanediol dimethacrylate, 1,3-butanediol dimethacrylate, neopentyl glycol dimethacrylate, diethylene glycol dimethacrylate, triethylene glycol dimethacrylate, tetraethylene glycol dimethacrylate, polyethylene glycol dimethacrylate, tripropylene glycol dimethacrylate, polypropylene glycol dimethacrylate, bisphenol A, a reactant of 1 mole of bisphenol F or bisphenol AD and 2 moles of glycidyl methacrylate, dimethacrylate of a polyethylene oxide adduct of bisphenol A, bisphenol F, or bisphenol AD, a polypropylene oxide adduct of bisphenol F or bisphenol AD, bis(methacryloxypropyl) polydimethyl siloxane, and a bis(methacryloxypropyl) methyl siloxane-dimethyl siloxane copolymer.

One type of such compounds can be used singularly, or two or more types thereof can be used in combination. In a case where the thermosetting resin contains the (meth) acrylic resin, such compounds may be used after being polymerized in advance, or such compounds may be mixed together with the conductive particles, the flux activator, and the like, and may be polymerized simultaneously with the mixing. One type of such compounds having a polymerizable carbon-carbon double bond in the molecules can used singularly, or two or more types thereof can be used in combination.

In a case where the thermosetting resin contains the (meth)acrylic resin, the conductive adhesive composition may further contain a radical polymeric initiator. As the radical polymeric initiator, an organic peroxide is preferable, from the viewpoint of effectively suppressing voids. A decomposition temperature of the organic peroxide may be 130° C. to 200° C., from the viewpoint of improving curing properties and viscosity stability of the adhesive component.

As the radical polymeric initiator, a radical polymeric initiator that is generally used can be used, and examples thereof include a peroxide such as benzoyl peroxide and t-butyl peroxy-2-ethyl hexanoate, and an azo compound such as azobisisobutyronitrile and azobisdimethyl valeronitrile.

The content of the radical polymeric initiator may be 0.01 to 20% by mass, 0.1 to 10% by mass, or 0.5 to 5% by mass, with respect to the total amount of the conductive adhesive composition.

As the (meth)acrylic resin, a (meth)acrylic resin that is commercially available can be used. Specific examples thereof include FINEDIC A-261 (Product Name, manufactured by Dainippon Printing Ink Manufacturing Co., Ltd.), and FINEDIC A-229-30 (Product Name, manufactured by Dainippon Printing Ink Manufacturing Co., Ltd.).

The content of the thermosetting resin in the conductive adhesive composition may be 1 to 60% by mass, 5 to 40% by mass, or 10 to 30% by mass, with respect to the total mass of the conductive adhesive composition.

(C) The flux activator is a component having a function of removing an oxide film formed on the surface of the conductive particles. By using such a flux activator, the oxide film that hinders the melting and the aggregation of the conductive particles is removed. The flux activator according to an embodiment contains a compound having a hydroxyl group and a carboxyl group. The compound is capable of exhibiting excellent flux activity and of exhibiting reactivity with an epoxy resin that can be used as the thermosetting resin. The compound having a hydroxyl group and a carboxyl group may be an aliphatic dihydroxycarboxylic acid, from the viewpoint of exhibiting excellent oxide film removal capability even in a case where the particle diameter of the conductive particles is small, and the amount of oxide film is large. Specifically, the flux activator may contain a compound represented by General Formula (V) described below, a tartaric acid, or a combination thereof

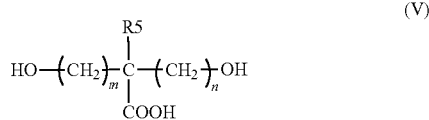

(V)

In Formula (V), R5 represents an alkyl group having 1 to 5 carbon atoms. R5 may be a methyl group, an ethyl group, or a propyl group, from the viewpoint of more effectively exhibiting the effects described above of the present invention. "n" and "m" each independently represent an integer of 0 to 5. "n" may be 0 and "m" may be 1, or both of "n" and "m" may be 1, from the viewpoint of more effectively exhibiting the effects described above of the present invention.

Examples of the compound represented by General Formula (V) described above include a 2,2-bis(hydroxymethyl) propionic acid, a 2,2-bis(hydroxymethyl) butanoic acid, and a 2,2-bis(hydroxymethyl) pentanoic acid. The flux activator may contain at least one type of compound selected therefrom.

The content of the flux activator may be 1.0 to 3.9% by mass, 1.8 to 3.9% by mass, or 1.5 to 3.5% by mass, with respect to the amount of conductive particles, from the viewpoint of more effectively exhibiting the effects of the present invention such as resistance to the reflow test at 260° C. The content of the flux activator may be 2.5 to 3.5% by mass with respect to the amount of conductive particles, from the viewpoint of the curing properties of the conductive adhesive composition and void suppression.

In a case where the thermosetting resin is an epoxy resin, the conductive adhesive composition may further contain (D) a curing catalyst. The curing catalyst (D) is a component that accelerates the curing of the epoxy resin. The curing catalyst may contain a compound having an imidazole group, from the viewpoint of the curing properties, the length of a usable time, heat resistance of the cured product, and the like. Examples of a commercially available product of the compound having an imidazole group include 2P4MHZ-PW (2-phenyl-4-methyl-5-hydroxymethyl imidazole), 2PHZ-PW (2-phenyl-4,5-dihydroxymethyl imidazole), C11Z-CN (1-cyanoethyl-2-undecyl imidazole), 2E4MZ-CN (1-cyanoethyl-2-ethyl-4-methyl imidazole), 2PZ-CN (1-cyanoethyl-2-phenyl imidazole), 2MZ-A (2,4-diamino-6-[2'methyl imidazolyl-(1')]-ethyl-s-triazine), 2E4MZ-A (2,4-diamino-6-[2'-ethyl-4'methyl imidazolyl-(1')]ethyl-s-triazine), and 2MAOK-PW (a 2,4-diamino-6-[2'-methyl imidazolyl-(1')]ethyl-s-triazine isocyanuric acid adduct) (Product Name, all are manufactured by SHIKOKU CHEMICALS CORPORATION). One type of such curing catalysts can used singularly, or two or more types thereof can be used in combination.

The content of the curing catalyst may be 0.01 to 90 parts by mass, or 0.1 to 50 parts by mass, with respect to 100 parts by mass of the epoxy resin. In a case where the content of the curing catalyst is less than 0.01 parts by mass, there is a tendency that the curing properties are degraded, and in a case where the content of the curing catalyst is greater than 90 parts by mass, there is a tendency that the viscosity increases, and the workability when handling the conductive adhesive composition is degraded.

The conductive adhesive composition may further contain a curing agent in order to adjust a curing rate of the epoxy resin.

The curing agent is not particularly limited insofar as the curing agent is used in the related art, and a commercially available curing agent is available. Examples of the commercially available curing agent include H-1 (Product Name, manufactured by Meiwa Plastic Industries, Ltd.) and VR-9300 (Product Name, manufactured by Mitsui Toatsu Chemicals, Inc.), which are a phenol novolac resin, XL-225 (Product Name, manufactured by Mitsui Toatsu Chemicals, Inc.) which is a phenol aralkyl resin, MTPC (Product Name, manufactured by Honshu Chemical Industry Co., Ltd.) which is a p-cresol novolac resin represented by General Formula (II) described below, AL-VR-9300 (Product Name, manufactured by Mitsui Toatsu Chemicals, Inc.) which is an allylated phenol novolac resin, and PP-700-300 (Product Name, manufactured by Nippon Petrochemicals Co., Ltd.) which is a special phenol resin represented by General Formula (III) described below.

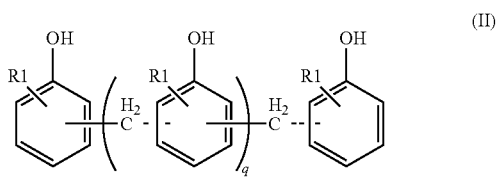

(II)

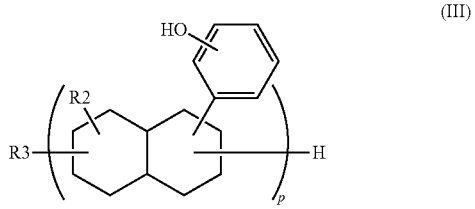
(III)

In Formula (II), a plurality of R1s each independently represent a monovalent hydrocarbon group, and may be a methyl group or an allyl group. "q" represents an integer of 1 to 5. In Formula (III), R2 represents an alkyl group, and may be a methyl group or an ethyl group. R3 represents a hydrogen atom or a monovalent hydrocarbon group, and p represents an integer of 2 to 4.

As the curing agent, dicyandiamide or the like that is used as a curing agent in the related art can be used, and a commercially available product is available. Examples of the commercially available product include ADH, PDH, and SDH (Product Name, all are manufactured by Nippon Hydrazine Industry, Co., Ltd.), which are dibasic acid dihydrazide represented by General Formula (IV) described below, and NOVACURE (Product Name, manufactured by Asahi Kasei Corp.) which is a microcapsule-type curing agent containing a reactant between an epoxy resin and an amine compound. One type of such curing agents can be used singularly, or two or more types thereof can be used in combination.

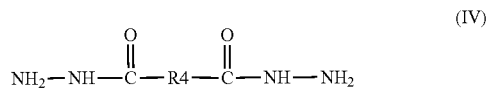
(IV)

In Formula (IV), R4 represents a bivalent aromatic group or a linear or branched alkylene group having 1 to 12 carbon atoms, and may be an m-phenylene group or a p-phenylene group.

The conductive adhesive composition may not substantially contain the curing agent, from the viewpoint of the preservation stability and a curing time. "Not substantially containing" indicates that the content is 0.05% by mass or less with respect to the total mass of the conductive adhesive composition.

The conductive adhesive composition may contain a filler. Examples of the filler include polymer particles such as acrylic rubber and polystyrene; and inorganic particles such as a diamond, boron nitride, aluminum nitride, alumina, and silica. One type of such fillers can be used singularly, or two or more types thereof may be used by being mixed.

The conductive adhesive composition may contain one or more types of additives selected from the group consisting of a flexibilizer for stress relaxation, a diluent for workability improvement, an adhesiveness improver, a wettability improver, and an antifoaming agent, as necessary, in addition to each of the components described above.

Examples of the flexibilizer include liquid polybutadiene (Product Name: "CTBN-1300×31" and "CTBN-1300×9", manufactured by Ube Industries, Ltd., and Product Name: "NISSO-PB-C-2000", manufactured by Nippon Soda Co., Ltd.). The content of the flexibilizer may be 0.1 to 500 parts by mass with respect to 100 parts by mass of the thermosetting resin.

Examples of the diluent include an organic solvent having a comparatively high boiling point, such as butyl carbitol, butyl carbitol acetate, butyl cellosolve, carbitol, butyl cellosolve acetate, carbitol acetate, dipropylene glycol monomethyl ether, ethylene glycol diethyl ether, and α-terpineol. The content of the diluent may be 0.1 to 30% by mass with respect to the total mass of the conductive adhesive composition.

The adhesiveness improver may be a coupling agent such as a silane coupling agent or a titanium coupling agent. Examples of the silane coupling agent include "KBM-573" (Product Name, manufactured by Shin-Etsu Chemical Co., Ltd.). The wettability improver, for example, may be an anionic surfactant or a fluorine-based surfactant. The antifoaming agent, for example, may be silicone oil. One type of each of the adhesiveness improvers, the wettability improvers, and the antifoaming agents can be used singularly, or two or more types thereof can be used in combination. The content thereof may be 0.1 to 10% by mass with respect to the total mass of the conductive adhesive composition.

Any of the components exemplified as described above may be combined.

The conductive adhesive composition is obtained by mixing, dissolving, degraining and kneading, or dispersing each of the components described above at once or a plurality of times, together with heating, as necessary. The conductive adhesive composition may be in the shape of a paste in which each of the components is homogeneously dispersed. Examples of a dispersing/dissolving device that is used in such a case include known stirrers, milling machines, triple rolls, planetary mixers, and the like. The conductive adhesive composition may be in the shape of a paste at 25° C., and the viscosity thereof may be 5 to 400 Pa·s.

According to the conductive adhesive composition of this embodiment described above, in an electrode pad having a small area or a circuit board having electrodes arranged at a narrow pitch, mounting components can be connected with excellent conductivity without causing a short circuit between the electrodes. In a step of mounting electronic components on the circuit board having the electrodes arranged at a narrow pitch, the conductive adhesive composition of this embodiment is capable of setting a reflow heating temperature to a low temperature, and of suppressing the warpage of the circuit board. A connection part that is formed by the conductive adhesive composition of this embodiment can have a conductive portion containing the conductive particles, and a resin portion containing an insulating adhesive component. The reinforcement of the resin portion is capable of contributing to the improvement of the resistance of a connection structure to a temperature cycling test. Further, even in a reflow process at 260° C., connection properties can be maintained without breaking the reinforcement resin portion.

Next, a substrate mounted with an electronic component as an example of the connection structure will be described with reference to FIG. 1 and FIG. 2.

FIG. 1 is a schematic sectional view illustrating an embodiment of the connection structure. A connection structure 1 illustrated in FIG. 1 is a substrate mounted with an electronic component, having: a circuit board 2 that has a base material 5 and two or more connection terminals 7 formed on the main surface of the base material 5; an electronic component 3 that faces the circuit board 2 and has a main body 4 and two or more connection terminals 6; and a connection part 8 that is arranged between the circuit board 2 and the electronic component 3 and joins the circuit board and the electronic component. The connection part 8 has a conductive portion 8a that is arranged between the connection terminal 7 of the circuit board 2 and the connection terminal 6 of the electronic component 3 and electrically connects the connection terminals, and a resin portion 8b that is formed around the conductive portion 8a. The connection part 8 is a cured product of the conductive adhesive composition according to the embodiment described above. The conductive portion 8a mainly contains an aggregate of the conductive particles contained in the conductive adhesive composition. The resin portion 8b mainly contains a cured product of the adhesive component containing the thermosetting resin and the curing catalyst, contained in the conductive adhesive composition. Here, the resin portion 8b is capable of containing a small amount of conductive particles in a range where suitable insulating properties are maintained. The circuit board 2 and the electronic component 3 are joined to each other by the connection part 8, and are electrically connected to each other.

The connection structure 1, for example, can be produced by a method, including: a step of preparing the circuit board 2 and the electronic component 3 having two or more connection terminals 7 and 6, respectively, and of arranging the conductive adhesive composition on the connection terminal 7 of the circuit board 2 or the connection terminal 6 of the electronic component 3; a step of arranging the electronic component 3 on the circuit board 2 such that the connection terminal 7 of the circuit board 2 faces the connection terminal 6 of the electronic component 3 via the conductive adhesive composition placed on the connection terminal 7 or on the connection terminal 6, and of obtaining a temporary connection body having the circuit board 2, the conductive adhesive composition, and the electronic component 3; and a step of forming the connection part 8 having the conductive portion 8a that contains the conductive particles in the conductive adhesive composition and electrically connects the connection terminal 7 of the circuit board 2 and the connection terminal 6 of the electronic component 3, and the resin portion 8b that is formed around the conductive portion 8a, by heating the temporary connection body, and of obtaining the connection structure 1.

The conductive adhesive composition can be applied to the connection terminal of the circuit board or the electronic component by a method such as a dispensing method, a screen printing method, and a sputtering method. The temporary connection body can be heated by using a heater such as an oven or a reflow furnace. The temporary connection body may be heated under pressure, as necessary. In general, the connection part 8 having the conductive portion 8a and the resin portion 8b is formed while the conductive adhesive composition is heated and cured. The conductive portion 8a contains the aggregate formed by the fusion of the conductive particles that are melted by heating. The aggregate is joined to the connection terminal of the circuit board and the electronic component and forms a metal connection path.

Figure 2:
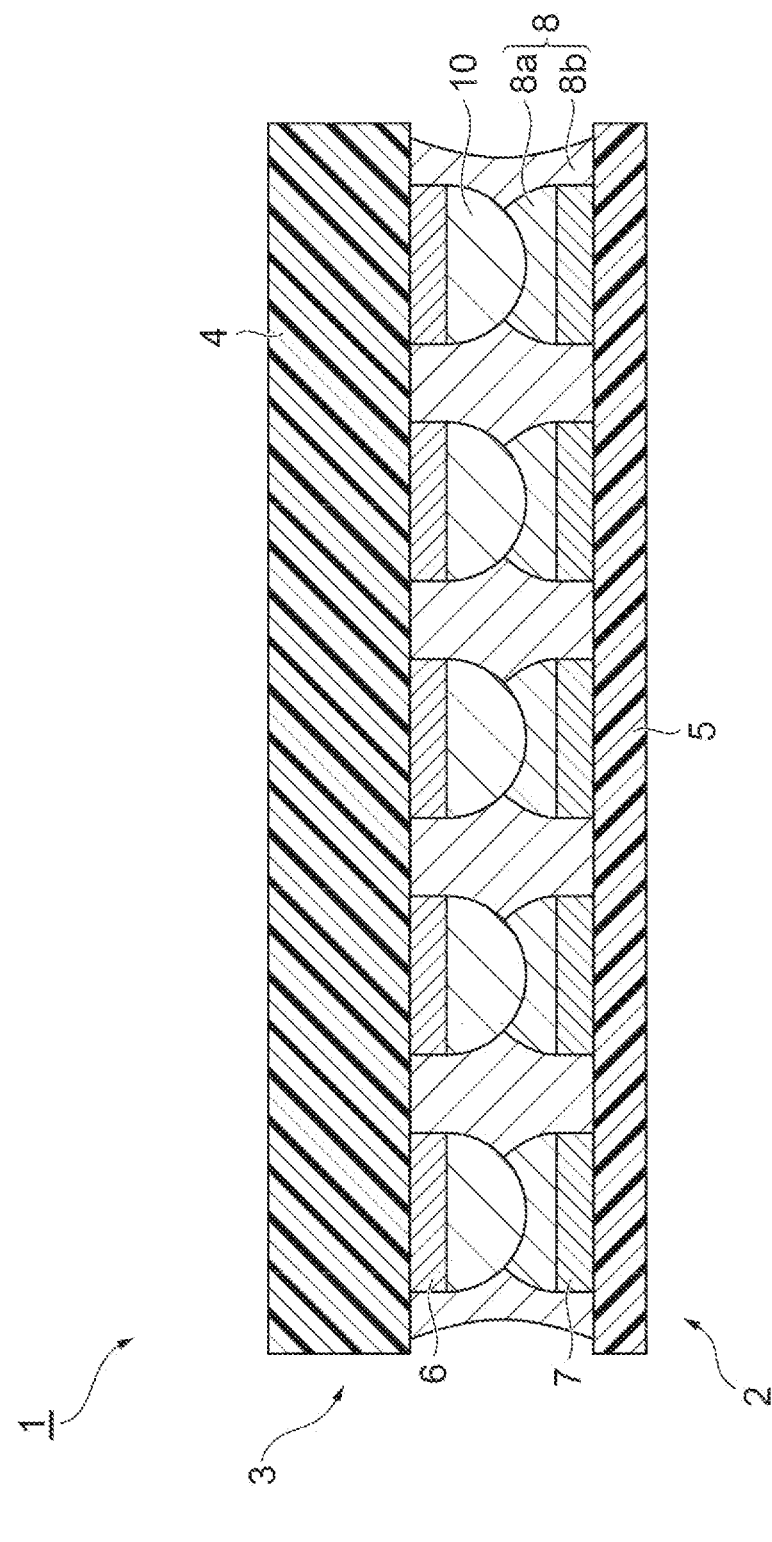
FIG. 2 is a schematic sectional view illustrating an embodiment of the connection structure.

In a case of the connection structure 1 illustrated in FIG. 2, a solder ball 10 is provided on the conductive portion 8a containing the conductive adhesive composition and the connection terminal 6 of the electronic component 3, and the solder ball 10 and the connection terminal 7 of the circuit board 2 are electrically connected by the conductive portion 8a. That is, the connection terminal 7 of the circuit board 2 and the connection terminal 6 of the electronic component 3 are electrically connected via the conductive portion 8a and the solder ball 10. The connection terminals 7 of the circuit board 2 may be arranged on the main surface of the base material 2 at an interval of 200 μm or less.

In such a connection structure, the conductive portion 8a is reinforced by the resin portion 8b. In a case where the connection structure is subjected to heat history of the temperature cycling test, a large strain is applied to the connection part and other constituents due to the occurrence of warpage or the like. Since the conductive portion 8a is reinforced by the resin portion 8b, the deformation of the base material is prevented by the resin portion 7b, and the occurrence of a crack in the connection part is suppressed.

When the sectional surface of the connection structure along a thickness direction is seen in a position where the connection terminal of the electronic component has the maximum width, an area ratio of the conductive portion and the resin portion may be 5:95 to 80:20.

The electronic component may be a solid-state image sensing device such as CMOS.

As described above, preferred embodiments of the present invention have been described, but the present invention is not limited to the embodiments described above. The present invention can be variously modified within a range not departing from the gist thereof.

EXAMPLES

Hereinafter, the present invention will be described in more detail by Examples. However, the present invention is not limited to such Examples.

1. Material (A) Conductive Particles

STC-7: Sn42-Bi58 Particles (D50: 8.0 μm, D10: 5.3 μm, D90: 10.3 μm, Dmin: 2.8 μm, Dmax: 20 μm, manufactured by MITSUI MINING & SMELTING CO., LTD., melting point: 138° C.)

STC-5: Sn42-Bi58 Particles (D50: 6.4 μm, D10: 4.6 μm, D90: 8.7 μm, Dmin: 1.7 μm, Dmax: 13 μm, manufactured by MITSUI MINING & SMELTING CO., LTD., melting point: 138° C.)

STC-3: Sn42-Bi58 Particles (D50: 4.1 μm, D10: 2.7 μm, D90: 6.0 μm, Dmin: 1.0 μm, Dmax: 11 μm, manufactured by MITSUI MINING & SMELTING CO., LTD., melting point: 138° C.)

ST-5: Sn42-Bi58 Particles (D50: 5.3 μm, D10: 2.3 μm, D90: 8.5 μm, Dmin: 0.7 μm, Dmax: 14 μm, manufactured by MITSUI MINING & SMELTING CO., LTD., a melting point: 138° C.)

ST-3: Sn42-Bi58 Particles (D50: 3.1 μm, D10: 1.7 μm, D90: 5.0 μm, Dmin: 0.6 μm, Dmax: 11 μm, manufactured by MITSUI MINING & SMELTING CO., LTD., a melting point: 138° C.)

Sn42-Bi57-Ag1 Particles (D50: approximately 5 μm, D10: 2.2 μm, D90: 8.6 μm, Dmin: 0.7 μm, Dmax: 14 μm)

(B) Thermosetting Resin

YL980 (Product Name of Bisphenol A-Type Epoxy Resin, manufactured by Mitsubishi Chemical Corporation)

(C) Flux Activator

BHPA: 2,2-Bis(Hydroxymethyl) Propionic Acid

BHBA: 2,2-Bishydroxymethyl Butanoic Acid

Tartaric Acid (D) Curing Catalyst

2P4MHZ-PW (Product Name of Imidazole Compound, manufactured by SHIKOKU CHEMICALS CORPORATION)

2. Conductive Adhesive Composition

Example 1

15.2 parts by mass of YL980, 0.8 parts by mass of 2P4MHZ-PW, and 3.0 parts by mass of BHPA as a flux activator were mixed, and the mixture passed through a triple roll three times. Subsequently, 81 parts by mass of STC-7 which is Sn42-Bi58 particles was added to 19 parts by mass of the mixture. The mixture was stirred with a planetary mixer, and was subjected to a defoaming treatment at 500 Pa or less for 10 minutes to obtain a conductive adhesive composition.

Examples 2 to 16 and Comparative Examples 1 to 20

Conductive adhesive compositions of Examples 2 to 16 and Comparative Examples 1 to 20 were obtained as with Example 1, except that a compounding ratio (parts by mass) was changed as shown in Table 1, Table 2, or Table 3.

Comparative Examples 21 to 23

Commercially available conductive adhesives described below were prepared.

Comparative Example 21: Ag Paste (DOTITE (Product Name), manufactured by Fujikura Kasei Co., Ltd.)

Comparative Example 22: Sn42-Bi58 Cream Solder (ECO SOLDER (Product Name), manufactured by SENJU METAL INDUSTRY CO., LTD.)

Comparative Example 23: Sn96.5-Ag3-Cu0.5 Cream Solder (ECO SOLDER, manufactured by SENJU METAL INDUSTRY CO., LTD.)

3. Evaluation of Adhesiveness, Conductivity, and TCT Resistance

The properties of the conductive adhesive compositions of each of Examples and Comparative Examples were evaluated by the following methods. The results were collectively shown in Table 1, Table 2, and Table 3. In the tables, "Flux/Metal ratio (%)" indicates a ratio (% by mass) of the flux activator to the conductive particles.

(1) Adhesiveness (Adhesion Strength)

Approximately 0.5 mg of the conductive adhesive composition was applied onto a silver-plated copper plate, and a flat rectangular plate-shaped tin-plated copper plate of 2 mm×2 mm×0.25 mm was pressure-bonded thereon to obtain a test piece. The obtained test piece was subjected to heat history at 150° C. for 10 minutes. Here, the test piece of Comparative Example 23 was subjected to heat history at 260° C. for 10 minutes. Adhesion strength (shear strength) at 25° C. of each of the test pieces after being subjected to the heat history was measured in a condition of a shear rate of 500 μm/sec and a clearance of 100 μm by using a bond tester (2400, manufactured by Dage).

(2) Conductivity (Volume Resistivity)

Two strip-shaped gold-plated copper plates of 1 mm×50 mm×0.03 mm were pasted orthogonal to each other via the conductive adhesive composition to obtain a test piece. The size of the adhesive in the orthogonal portion of the copper plates was 1 mm×1 mm×0.03 mm. Subsequently, the test piece was subjected to the same heat history as that of the evaluation method in "(1) Adhesiveness". After that, a volume resistivity of each of the test pieces was measured by a four-terminal method.

(3) TCT Resistance

A flat rectangular plate-shaped thin FR4 substrate of 100 mm×50 mm×0.5 mm in which two adjacent copper foil lands (0.2 mm×0.4 mm) are provided and a distance between the copper foil lands is 100 μm was prepared. The conductive adhesive composition was printed on the copper foil land by using a metal mask (a thickness of 100 μm, an opening size of 0.2 mm×0.3 mm). A small chip resistance (0.2 mm×0.4 mm) in which a distance between electrodes is 100 μm was placed thereon such that the electrode faced the copper foil land via the conductive adhesive composition. The obtained component mounting substrate was subjected to the same heat history as that of the evaluation in "(1) Adhesiveness" to obtain a test substrate for evaluating TCT resistance. The initial resistance of the test substrate was checked by using a simple tester. After that, the test substrate was subjected to a thermal shock test in which a temperature change in order of retention at −55° C. for 30 minutes, a temperature increase to 125° C. for 5 minutes, retention at 125° C. for 30 minutes, and a temperature decrease to −55° C. for 5 minutes is set to one cycle, by using a thermal shock tester. Connection resistance of the test substrate after the thermal shock test was measured. The connection resistance of the test substrate was measured while increasing the number of cycles, and the maximum number of cycles in which a resistance change rate within ±10% is allowed for the initial resistance was set to an index of the TCT resistance.

(4) 260° C. Reflow Resistance

A flat rectangular plate-shaped thin FR4 substrate of 100 mm×50 mm×0.5 mm in which two adjacent copper foil lands (0.2 mm×0.4 mm) are provided and a distance between the copper foil lands is 100 μm was prepared. The conductive adhesive composition was printed on the copper foil land by using a metal mask (a thickness of 100 μm, an opening size of 0.2 mm×0.3 mm). A small chip resistance (0.2 mm×0.4 mm) in which a distance between electrodes is 100 μm was placed thereon such that the electrode faced the copper foil land via the conductive adhesive composition. The obtained component mounting substrate was subjected to the same heat history as that of the evaluation in "(1) Adhesiveness" to obtain a test substrate for evaluating 260° C. reflow resistance.

The initial resistance of the test substrate was measured by using a simple tester. After that, the test substrate was subjected to a reflow test in which the test substrate is heated with a 260° C. reflow profile (heating at the maximum temperature of 260° C./for 30 seconds), by using a reflow simulator device (High Temperature Observation Equipment SK-5000, manufactured by SANYOSEIKO. CO., LTD.). Connection resistance of the test substrate after being subjected to the reflow test three times was measured, and a ratio of the connection resistance after the reflow test to the connection resistance before the reflow test was set to a resistance change rate. In the tables, "Good" indicates that the resistance change rate is within ±10%, and "Poor" indicates that the resistance change rate exceeds ±10%.

TABLE 1

| | | Examples | | | | | | | |
|---|---|---|---|---|---|---|---|---|---|
| | | 1 | 2 | 3 | 4 | 5 | 6 | 7 | 8 |
| Thermosetting resin | YL980 | 15.2 | 15.2 | 15.2 | 12.8 | 12.8 | 12.8 | 15.2 | 15.2 |
| Curing catalyst | 2P4MHZ-PW | 0.8 | 0.8 | 0.8 | 0.6 | 0.6 | 0.6 | 0.8 | 0.8 |
| Flux activator | BHPA | 3.0 | 3.0 | 3.0 | 2.6 | 2.6 | 2.6 | — | — |
| | BHBA | — | — | — | — | — | — | 3.0 | — |
| | Tartaric acid | — | — | — | — | — | — | — | 3.0 |
| Conductive particles | Sn42—Bi58 STC-7 | 81 | — | — | 84 | — | — | — | — |
| | Sn42—Bi58 STC-5 | — | 81 | — | — | 84 | — | 81 | 81 |
| | Sn42—Bi58 STC-3 | — | — | 81 | — | — | 84 | — | — |
| Flux/Metal ratio (%) | | 3.8 | 3.8 | 3.8 | 3.1 | 3.1 | 3.1 | 3.8 | 3.8 |
| Adhesion strength (MPa) | | 75 | 74 | 74 | 75 | 74 | 74 | 72 | 72 |
| Volume resistivity (×$10^{-5}$ Ω·m) | | 4.9 | 4.8 | 4.9 | 4.9 | 4.8 | 5.2 | 5.1 | 4.8 |
| TCT resistance (number of cycles) | | 2500 | 2500 | 2500 | 2500 | 2500 | 2500 | 2500 | 2500 |
| 260° C. reflow resistance | | Good | Good | Good | Good | Good | Good | Good | Good |

| | | Examples | | | | | | | |
|---|---|---|---|---|---|---|---|---|---|
| | | 9 | 10 | 11 | 12 | 13 | 14 | 15 | 16 |
| Thermosetting resin | YL980 | 12.8 | 12.8 | 8.0 | 26.0 | 8.0 | 26.0 | 8.0 | 26.0 |
| Curing catalyst | 2P4MHZ-PW | 0.6 | 0.6 | 0.4 | 1.3 | 0.4 | 1.3 | 0.4 | 1.3 |
| Flux activator | BHPA | — | — | 1.6 | 2.7 | 1.6 | 2.7 | 1.6 | 2.7 |
| | BHBA | 2.6 | — | — | — | — | — | — | — |
| | Tartaric acid | — | 2.6 | — | — | — | — | — | — |
| Conductive particles | Sn42—Bi58 STC-7 | — | — | 90 | 70 | — | — | — | — |
| | Sn42—Bi58 STC-5 | 84 | 84 | — | — | 90 | 70 | — | — |
| | Sn42—Bi58 STC-3 | — | — | — | — | — | — | 90 | 70 |
| Flux/Metal ratio (%) | | 3.1 | 3.1 | 1.8 | 3.9 | 1.8 | 3.9 | 1.8 | 3.9 |
| Adhesion strength (MPa) | | 72 | 72 | 72 | 72 | 72 | 72 | 72 | 72 |
| Volume resistivity (×$10^{-5}$ Ω·m) | | 5.2 | 5.1 | 5.1 | 5.1 | 5.1 | 5.1 | 5.1 | 5.1 |
| TCT resistance (number of cycles) | | 2500 | 2500 | 2500 | 2500 | 2500 | 2500 | 2500 | 2500 |
| 260° C. reflow resistance | | Good | Good | Good | Good | Good | Good | Good | Good |

TABLE 2

| | | Comparative Examples | | | | | | | |
|---|---|---|---|---|---|---|---|---|---|
| | | 1 | 2 | 3 | 4 | 5 | 6 | 7 | 8 |
| Thermosetting resin | YL980 | 17.7 | 17.7 | 17.7 | 17.7 | 21.0 | 28.1 | 30.9 | 15.9 |
| Curing catalyst | 2P4MHZ-PW | 0.9 | 0.9 | 0.9 | 0.9 | 1.0 | 1.4 | 1.5 | 0.8 |
| Flux activator | BHPA | 6.4 | — | — | 6.4 | 3.0 | 5.5 | 2.6 | 3.3 |
| | BHBA | — | 6.4 | — | — | — | — | — | — |
| | Tartaric acid | — | — | 6.4 | — | — | — | — | — |
| Conductive particles | Sn42—Bi58 ST-5 | 75 | 75 | 75 | — | 75 | 65 | 65 | 80 |
| | Sn42—Bi57—Ag1 | — | — | — | 75 | — | — | — | — |
| Flux/Metal ratio (%) | | 8.5 | 8.5 | 8.5 | 8.5 | 4.0 | 8.5 | 4.0 | 4.1 |
| Adhesion strength (MPa) | | 75 | 73 | 70 | 72 | 63 | 63 | 63 | 76 |
| Volume resistivity (×$10^{-5}$ Ω·m) | | 4.9 | 4.8 | 4.9 | 5.1 | 5.2 | 5.3 | 5.0 | 4.9 |
| TCT resistance (number of cycles) | | 2000 | 2000 | 2000 | 2000 | 1800 | 1800 | 1800 | 1800 |
| 260° C. reflow resistance | | Poor | Poor | Poor | Poor | Poor | Poor | Poor | Poor |

TABLE 3

| | | Comparative Examples | | | | | | | |
|---|---|---|---|---|---|---|---|---|---|
| | | 9 | 10 | 11 | 12 | 13 | 14 | 15 | 16 |
| Thermosetting resin | YL980 | 15.2 | 15.2 | 12.8 | 12.8 | 15.2 | 15.2 | 12.8 | 12.8 |
| Curing catalyst | 2P4MHZ-PW | 0.8 | 0.8 | 0.6 | 0.6 | 0.8 | 0.8 | 0.6 | 0.6 |
| Flux activator | BHPA | 3.0 | 3.0 | 2.6 | 2.6 | — | — | — | — |
| | BHBA | — | — | — | — | 3.0 | — | 2.6 | — |
| | Tartaric acid | — | — | — | — | — | 3.0 | — | 2.6 |
| Conductive particles | Sn42—Bi58 ST-5 | 81 | — | 84 | — | 81 | 81 | 84 | 84 |
| | Sn42—Bi58 ST-3 | — | 81 | — | 84 | — | — | — | — |
| Conductive adhesive | Ag paste | — | — | — | — | — | — | — | — |
| | Sn42—Bi58 cream solder | — | — | — | — | — | — | — | — |
| | Sn96.5—Ag3—Cu0.5 cream solder | — | — | — | — | — | — | — | — |
| Flux/Metal ratio (%) | | 3.8 | 3.8 | 3.1 | 3.1 | 3.8 | 3.8 | 3.1 | 3.1 |
| Adhesion strength (MPa) | | 45 | 45 | 35 | 35 | 35 | 35 | 30 | 30 |
| Volume resistivity (×10$^{-5}$ Ω · m) | | 10 | 10 | 10 | 10 | 10 | 10 | 10 | 10 |
| TCT resistance (number of cycles) | | 1200 | 1200 | 1000 | 1000 | 1100 | 1100 | 1000 | 1000 |
| 260° C. reflow resistance | | Good | Good | Good | Good | Good | Good | Good | Good |

| | | Comparative Examples | | | | | | |
|---|---|---|---|---|---|---|---|---|
| | | 17 | 18 | 19 | 20 | 21 | 22 | 23 |
| Thermosetting resin | YL980 | 8.0 | 26.0 | 8.0 | 26.0 | — | — | — |
| Curing catalyst | 2P4MHZ-PW | 0.4 | 1.3 | 0.4 | 1.3 | — | — | — |
| Flux activator | BHPA | 1.6 | 2.7 | 1.6 | 2.7 | — | — | — |
| | BHBA | — | — | — | — | — | — | — |
| | Tartaric acid | — | — | — | — | — | — | — |
| Conductive particles | Sn42—Bi58 ST-5 | 90 | 70 | — | — | — | — | — |
| | Sn42—Bi58 ST-3 | — | — | 90 | 70 | — | — | — |
| Conductive adhesive | Ag paste | — | — | — | — | 100 | — | — |
| | Sn42—Bi58 cream solder | — | — | — | — | — | 100 | — |
| | Sn96.5—Ag3—Cu0.5 cream solder | — | — | — | — | — | — | 100 |
| Flux/Metal ratio (%) | | 1.8 | 3.9 | 1.8 | 3.9 | — | — | — |
| Adhesion strength (MPa) | | 20 | 45 | 20 | 45 | 30 | 55 | 71 |
| Volume resistivity (×10$^{-5}$ Ω · m) | | 10 | 10 | 10 | 10 | 9.5 | 4.8 | 4.9 |
| TCT resistance (number of cycles) | | 800 | 1200 | 800 | 1200 | 900 | 300 | N/A |
| 260° C. reflow resistance | | Good | Good | Good | Good | Good | Poor | N/A |

In all of Examples 1 to 16, excellent adhesion strength, an excellent volume resistivity, excellent TCT resistance, and excellent 260° C. reflow resistance were exhibited. The warpage of the test substrate was hardly observed. In Comparative Examples 1 to 8, it was checked that the 260° C. reflow resistance was degraded, and the TCT resistance was degraded compared to Examples 1 to 16. In Comparative Examples 9 to 20, the 260° C. reflow resistance was excellent, but the volume resistivity increased, and the adhesion strength and the TCT resistance were degraded. Accordingly, it was suggested that melting properties of the solder particles were degraded, and a connection failure occurred. In Comparative Example 21, the 260° C. reflow resistance was excellent, but the adhesion strength and the TCT resistance were degraded compared to Examples 1 to 16. In Comparative Example 22, the adhesion strength, the volume resistivity, the TCT resistance, and the 260° C. reflow resistance were degraded compared to Examples 1 to 16. In Comparative Example 23, when performing heating connection at 260° C., the substrate was greatly warped, and the connection part was damaged. Accordingly, the TCT resistance and the 260° C. reflow resistance could not be measured.

REFERENCE SIGNS LIST

1: connection structure, 2: circuit board, 3: electronic component, 4: main body of electronic component, 5: base material, 6: connection terminal of electronic component, 7: connection terminal of circuit board, 8: connection part, 8a: conductive portion, 8b: resin portion, 10: solder ball.

The invention claimed is:

1. A conductive adhesive composition, comprising:
conductive particles;
a thermosetting resin; and
a flux activator,
wherein the conductive particles comprise a metal having a melting point of 200° C. or lower, a cumulative 50% particle diameter is 3 to 10 μm, and a cumulative 10% particle diameter is 2.4 μm or more, in a volume-based cumulative particle size distribution of the conductive particles, the flux activator comprises a compound having a hydroxyl group and a carboxyl group, and a content of the conductive particles is 30 to 90% by mass with respect to a total mass of the conductive adhesive composition.

2. The conductive adhesive composition according to claim 1, wherein a content of the flux activator is 1.0 to 3.9% by mass with respect to an amount of the conductive particles.

3. The conductive adhesive composition according to claim 1, wherein a cumulative 90% particle diameter is 12 μm or less in the volume-based cumulative particle size distribution of the conductive particles.

4. The conductive adhesive composition according to claim 1, wherein a minimum particle diameter is 1.0 μm or more in the volume-based cumulative particle size distribution of the conductive particles.

5. The conductive adhesive composition according to claim 1, wherein a maximum particle diameter is 20 μm or less in the volume-based cumulative particle size distribution of the conductive particles.

6. The conductive adhesive composition according to claim 1, wherein the metal having a melting point of 200° C. or lower that is comprised in the conductive particles comprises at least one selected from bismuth, indium, tin, and zinc.

7. The conductive adhesive composition according to claim 1, wherein the thermosetting resin comprises an epoxy resin.

8. The conductive adhesive composition according to claim 7, further comprising a curing catalyst.

9. The conductive adhesive composition according to claim 1, wherein the conductive particles comprise metal particles containing only metal.

10. A method for producing a connection structure, comprising:

preparing a circuit board comprising two or more connection terminals and an electronic component comprising two or more connection terminals, and placing the conductive adhesive composition according to claim 1 on a connection terminal of the two or more connection terminals of the circuit board or on a connection terminal of the two or more connection terminals of the electronic component;

arranging the electronic component on the circuit board such that the connection terminal of the circuit board faces the connection terminal of the electronic component via the conductive adhesive composition, to obtain a temporary connection body comprising the circuit board, the conductive adhesive composition, and the electronic component; and heating the temporary connection body and thereby forming a connection part comprising a conductive portion and a resin portion, said conductive portion comprising conductive particles in the conductive adhesive composition and electrically connecting the connection terminal of the circuit board and the connection terminal of the electronic component and said resin portion being formed around said conductive portion, to obtain a connection structure in which the circuit board and the electronic component are joined by the connection part.

* * * * *